United States Patent
Shih et al.

(10) Patent No.: US 7,957,827 B2
(45) Date of Patent: Jun. 7, 2011

(54) METHOD OF CONTROLLING STATUSES OF WAFERS

(75) Inventors: Hui-Shen Shih, Changhua Hsien (TW); Yu-Fang Chien, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 409 days.

(21) Appl. No.: 11/965,565

(22) Filed: Dec. 27, 2007

(65) Prior Publication Data

US 2009/0171495 A1 Jul. 2, 2009

(51) Int. Cl.
*H01L 21/00* (2006.01)
*G01B 5/02* (2006.01)
*G01B 3/22* (2006.01)
*G01B 5/20* (2006.01)
*G01D 1/00* (2006.01)
*G06F 15/00* (2006.01)
*G06F 19/00* (2006.01)

(52) U.S. Cl. .............................. 700/121; 438/5; 702/159

(58) Field of Classification Search .................. 700/121, 700/164, 175; 702/127, 159, 167; 438/5
See application file for complete search history.

(56) References Cited

U.S. PATENT DOCUMENTS

| | | | |
|---|---|---|---|
| 5,131,752 A | 7/1992 | Yu et al. | |
| 5,319,570 A * | 6/1994 | Davidson et al. | 716/4 |
| 5,402,367 A | 3/1995 | Sullivan et al. | |
| 5,503,707 A | 4/1996 | Maung et al. | |
| 5,751,582 A | 5/1998 | Saxena et al. | |
| 5,761,064 A * | 6/1998 | La et al. | 700/110 |
| 5,872,694 A * | 2/1999 | Hoinkis et al. | 361/234 |
| 5,922,212 A * | 7/1999 | Kano et al. | 216/2 |
| 6,080,042 A * | 6/2000 | McGregor et al. | 451/41 |
| 6,298,470 B1 * | 10/2001 | Breiner et al. | 716/4 |
| 6,509,201 B1 * | 1/2003 | Wright | 438/16 |
| 6,608,689 B1 * | 8/2003 | Wei et al. | 356/630 |
| 6,724,487 B2 * | 4/2004 | Marcus et al. | 356/497 |
| 6,762,846 B1 * | 7/2004 | Poris | 356/609 |
| 7,101,816 B2 * | 9/2006 | Kaushal et al. | 438/795 |
| 7,230,680 B2 * | 6/2007 | Fujisawa et al. | 355/72 |
| 7,247,556 B2 * | 7/2007 | Nanda et al. | 438/624 |
| 7,452,793 B2 * | 11/2008 | Kaushal et al. | 438/530 |
| 2002/0192966 A1 * | 12/2002 | Shanmugasundram et al. | 438/692 |
| 2006/0241891 A1 * | 10/2006 | Kaushal et al. | 702/136 |
| 2007/0177127 A1 * | 8/2007 | Fujisawa et al. | 355/72 |
| 2007/0272680 A1 * | 11/2007 | Tadokoro et al. | 219/494 |

FOREIGN PATENT DOCUMENTS

| | | | |
|---|---|---|---|
| JP | 05-102044 | * | 4/1993 |
| JP | 06-302550 | * | 10/1994 |
| JP | 10-270360 | * | 10/1998 |

OTHER PUBLICATIONS

Wikipedia's definition for the term "wafer"; 6 pages. Printed from Internet on Mar. 19, 2010.*
"90 nm Generation, 300mm Wafer Low k ILD/Cu Interconnect Technology" Jan et al., Jun. 2-4, 2003, pp. 15-17, Logic Technology Development Intel Corporation, Hillsboro, OR, USA.

* cited by examiner

*Primary Examiner* — Ronald D Hartman, Jr.
(74) *Attorney, Agent, or Firm* — WPAT, PC; Justin King

(57) ABSTRACT

A method of controlling statuses of a plurality of wafers is described. A status of a wafer among the wafers is determined. An action related to the status is taken, according to the status determined, to the wafer and/or other wafers to improve a yield or yields thereof.

3 Claims, 3 Drawing Sheets

METHOD OF CONTROLLING STATUSES OF WAFERS

BACKGROUND OF THE INVENTION

1. Field of Invention

This invention relates to an integrated circuit (IC) manufacturing process, and more particularly to a method of controlling the statuses of a plurality of wafers in an IC manufacturing process.

2. Description of Related Art

Because a current IC manufacturing process includes numerous steps, the status of each wafer has to be monitored at every moment for a higher yield. For example, an originally flat wafer is warped upward or downward after a film causing a tensile or compressive stress is formed thereon, after a high-temperature process is conducted thereto or after a film thereon is removed by CMP or other method. After numerous processes affecting the degree of warp are conducted, the progressive upward or downward warp of the wafer could be overly large, especially as the diameter of a wafer is larger than 8 inches.

Warp of a wafer can be detected, for example, in a physical vapor deposition (PVD) process that uses a ring-shaped clamp contacting the edge of the wafer and a backside gas supplied into a table under the wafer to fix the wafer on the table. If the wafer is warped, the backside gas would exit from under the wafer to greatly increase-the-pressure detected in the chamber.

When the warpage of a wafer is overly large, cracks may occur to the edge of the wafer when a ring-shaped clamp is used to fix the wafer on a table or when a claw-like clamp is used to hold the wafer, and the cracks easily extend in subsequent processes to significantly damage the dies. Moreover, an overly warped wafer cannot be stably fixed on an electrostatic chuck, for an electrostatic chuck can merely contact with a central portion of an upward warped wafer or an edge portion of a downward warped wafer. In addition, when a wafer is overly warped, the patterns on a photomask cannot be transferred accurately onto a photoresist layer coated on the warped wafer.

Accordingly, it is an important issue to control the warpage of a wafer, especially when the diameter of the wafer is larger than 8 inches.

SUMMARY OF THE INVENTION

Accordingly, this invention provides a method of controlling statuses of a plurality of wafers in an IC manufacturing process.

The method of controlling statuses of a plurality of wafers of this invention is described as follows. A status of a wafer among the wafers is determined, and then an action related to the status is taken, according to the status determined, to the wafer and/or other wafers to improve the yield or yields thereof.

It is noted that the term "the wafer and/or other wafers" means "the wafer, other wafers, or the wafer and other wafers" through the specification of this application.

In order to make the aforementioned and other objects, features and advantages of the present invention comprehensible, a preferred embodiment accompanied with figures is described in detail below.

DESCRIPTION OF EMBODIMENTS

Figure 1:
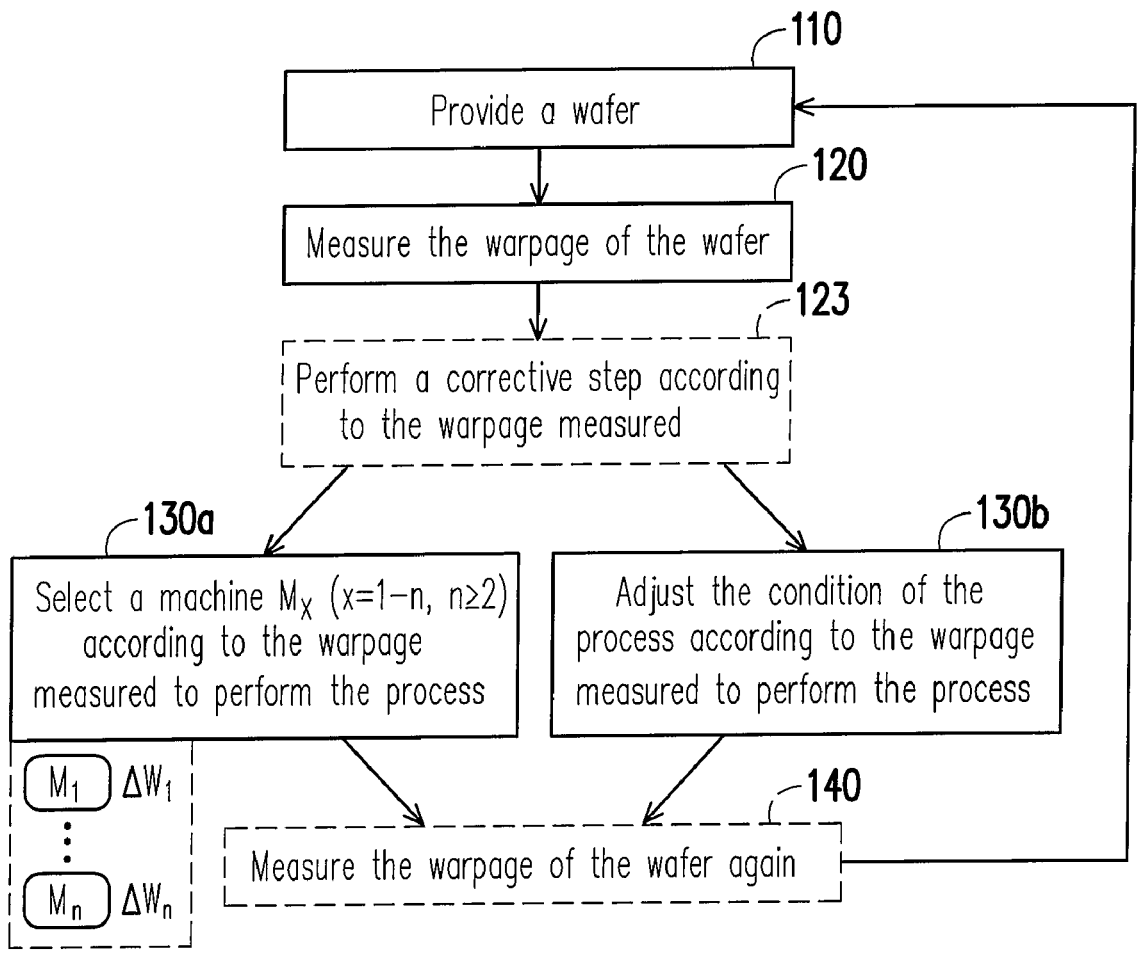
FIG. 1 is a flow chart showing a method of controlling the warpages of wafers subjected to a fabricating process according to a first embodiment of this invention.

In the method of controlling statuses of a plurality of wafers of this invention, a status of a wafer among the wafers is determined, and then an action related to the status is taken, according to the status determined, to the wafer and/or other wafers to improve the yield(s) thereof. The above steps may be performed in a closed loop with plan do-check-action (PDCA) cycles.

In an embodiment, the plurality of wafers is one lot of wafers. The control can be a lot-base control where only the status of a wafer is determined and the same action taken to the wafer is also taken to the other wafer, or alternatively a wafer-base control where the status of each wafer is determined and each wafer is subjected to an action according to the status thereof. In a case where the status of a wafer is expressed by a parameter of the wafer, a wafer-base control is preferred when the relative variation of the values of the parameter between the plurality of wafers is more than 10%.

In an embodiment, the status of the wafer is a stress at the wafer, which can be obtained with a stress tool for wafer radius measurement or from the daily monitor data of the wafers.

In an embodiment, the status of the wafer is the radius of curvature of the wafer or the warpage of the wafer, which can be obtained with a stress tool for wafer radius measurement or with a wafer warpage measurement. Usually, the warpage of a wafer is monitored when the diameter of the wafer is larger than 8 inches.

In an embodiment, the status of the wafer is the surface topography of the wafer, which can be obtained from the data feedback from certain lithography tools.

In an embodiment, the status of the wafer is die failure statistics of the wafer or a die failure map of the wafer, which can be obtained from the resulting data of a circuit performance bin analysis in which all dies are subjected to different items of circuit tests and the dies failing in respective items are determined.

In an embodiment, the status of the wafer is the thickness distribution of the wafer, which may be obtained from the daily monitor data of the wafers.

In an embodiment, the status of the wafer is statistics of the defects on the wafer obtained from defect measurement data.

In an embodiment, the status of the wafer is the break status of the wafer that is obtained from wafer break status data.

In an embodiment, the status of the wafer is statistic of metal hillocks/voids on the wafer, which can be obtained from the data of hillocks/void inspections for wafer outgoing quality assurance (OQA).

In addition, the action taken to the wafer and/or other wafers may include at least one selected from the group consisting of wafer rotation, selecting a machine for a fabricating process, adjusting a parameter of a fabricating process, removing a thickness of a film, performing a scrubber treatment, performing a temperature change treatment, performing a UV-curing treatment, performing a plurality of deposition steps with vacuum breaking between them, and adjusting a wafer cooling rate.

A wafer rotation action affects the stress distribution at a wafer or the notch angle of a wafer. For example, in an Al-deposition step using a clamp to press-fix the wafer, rotating the wafer previously can prevent a stress concentration point of the wafer from being pressed by the clamp to cause wafer break. In another example where a furnace is used for a thermal process, rotating the wafer before the thermal process can inhibit deformation of the wafer caused by unevenly distributed wafer supports. An excessive deformation of a wafer much lowers the alignment accuracy in a subsequent lithography process done to the wafer.

The action of selecting a machine for a fabricating process affects the warpage or stress of the wafer. For example, when it is found that a wafer having been subjected to a fabricating process is overly warped upward so that the wafer cannot be held well by the chuck in a later lithography process, selecting a machine capable of decreasing wafer warpage to perform the process for other wafers processed after the wafer can solve the wafer chuck failure issue. The selection can be made using a controller that is installed with the information of the processing characteristics of all the machines.

The action of adjusting a parameter of a fabricating process may affect the stress (distribution), the refractive index of a dielectric layer or the grain size of a metal film. For example, the RF power of a PECVD process can be fine tuned to control the stress distribution at the wafer and prevent excessive warpage that would cause chucking error in a subsequent lithography process. The temperature of a tungsten CVD step can be adjusted to lower the stress. In an Al-deposition chamber or other chamber that uses a clamp to press-fix the wafer, the backside gas pressure provided under the wafer can be adjusted to inhibit chipping of a wafer. Moreover, the plasma power of an HDP-CVD process in an STI process can be adjusted to generate a high temperature to release the stress and inhibit peeling of the SiN mask layer. The setting of the parameter can be made using a controller that is installed with the data of the correlation between the value of the parameter and the status of a wafer through the fabricating process.

The action of removing a thickness of a film affects the stress distribution at a wafer.

The action of performing a scrubber treatment may affect the stress at a wafer or the water absorption of a film. A scrubber treatment includes using deionized water to scrub or spray-wash the wafer to redistribute the stress thereat.

The action of performing a temperature change treatment affects the stress of a film, the warpage of a wafer and grain sizes of a metal film. The temperature change treatment may be a thermal treatment or a cooling treatment, which may be a −40° C. E-chuck treatment where an overly warped wafer that cannot be held well by the chuck of a lithography tool is placed on an electrostatic chuck set at −40° C. to redistribute the film stress and reduce the warpage thereof.

The action of performing a UV-curing treatment may affect the stress of a film, the dielectric constant (k-value) of a dielectric film or the grain size of a metal film.

The action of performing multiple deposition steps with vacuum breaking between them may affect the stress at a film, the grain distribution of a metal film or the grain size of a metal film. During the period of the vacuum breaking, a scrubber treatment as described above can be conducted. For example, in a prior-art process including five deposition steps for forming a composite layer of Ti/TiN/Al/Ti/TiN, it is possible to break the vacuum and then perform an above-mentioned scrubber treatment between the deposition steps of Ti/TiN and those of Al/Ti/TiN.

The action of adjusting a wafer cooling rate may affect the stress at a film or the grain size of a metal film. The cooling rate can be adjusted by controlling the flow of the cooling gas.

In some cases, for example, the step of determining the status of a wafer includes measuring its warpage and the action is a warp-related action according to the warpage measured. The warp-related action may include at least one selected from the group consisting of rotating the wafer before a fabricating process conducted to the wafers, performing an aforementioned scrubber treatment, performing UV-curing, performing a temperature change treatment, selecting a machine from a plurality of machines that are for conducting a fabricating process conducted for the wafers but cause different warpages to originally flat dummy wafers, and adjusting a condition of a fabricating process conducted for the wafers. Some such embodiments are provided below.

FIG. 1 is a flow chart showing a method of controlling the warpages of wafers subjected to a fabricating process according to a first embodiment of this invention. In the first embodiment, each wafer is measured for the warpage before being subjected to the fabricating process.

Referring to FIG. 1, in the step 110, a wafer among the wafers is provided. The wafer has been subjected to a precedent fabricating process that warps the wafer. For example, when the precedent fabricating process deposits a metal film, a tensile stress may be caused to warp the wafer upward; when the precedent fabricating process deposits a dielectric film, a tensile stress or a compressive stress may be caused to warp the wafer upward or downward. The progressive warpage of the wafer caused by the precedent process and the fabricating process to be performed has to be control so that a later fabricating process requiring flatness of the wafer will not be adversely affected.

In next step 120, the warpage of the wafer is measured. The measuring method may include using a laser beam to scan the wafer surface and analyzing the angles of reflected beam at different positions of the wafer. The warpage can be quantified as the height difference between the center and the edge of the wafer or the curvature of the wafer, for example.

Then, a warpage pre-inhibition treatment can be performed in option (step 123) to inhibit increase of the warpage in the fabricating process in advance or reduce the warpage before the fabricating process. The warpage pre-inhibition treatment may be a rotation of the wafer, a scrubber treatment, a TV-curing treatment or a temperature change treatment. A rotation of the wafer can inhibit increase of the warpage in the fabricating process in advance. A scrubber treatment, a UV-curing treatment or a temperature change treatment can reduce the warpage before the fabricating process.

In next step 130a corresponding to the aforementioned step of making a warp-related setting, a machine is selected according to the warpage measured to perform the fabricating process for the wafer. The machine is selected from a plurality of machines ($M_1$-$M_n$, $n \geq 2$) that are for conducting the same fabricating process but cause different warpages ($\Delta W_1$-$\Delta W_n$) to originally flat dummy wafers, wherein the data of warpages of the different machines may be previously collected by processing flat dummy wafers in them and analyzing the processed dummy wafers. When the warpage measured is positively larger (positive/negative warpage corresponds upward/downward warp in this application), a machine causing more negative or less positive warpage as compared with the others is selected. On the contrary, when the warpage measured is negatively larger, a machine causing more positive or less negative warpage as compared with the others is selected. The machine selection can be made by a controller that is installed with the information of the processing characteristics of each of the machines.

In an alternative step 130b corresponding to the step of making a warp-related setting, the condition of the fabricating process is adjusted to perform the fabricating process for the wafer. The information that which parameter(s) among all the parameters in conducting the fabricating process are correlated to wafer warp as well the data of the variation of warpage with the parameter(s) may be previously collected by processing a plurality of flat dummy wafers in different conditions and analyzing the processed dummy wafers with respect to the parameter variations. As the warpage measured is positively larger, a recipe causing more negative or less positive warpage is adopted. As the warpage measured is negatively larger, a recipe causing more positive or less negative warpage is adopted. The adjustment of the condition of the fabricating process can be made using a controller that is installed with the data of the correlation between the condition and the status of a wafer through the fabricating process.

The manner of making a warp-related setting does depend on the nature of the process. For example, for an inter-layer dielectric (ILD) deposition process utilizing atmospheric-pressure chemical vapor deposition (APCVD), a TiN deposition process, a tungsten CVD process, a tungsten chemical mechanical polishing (CMP) process or a aluminum deposition process, an increase or decrease in the warpage caused by the process can be controlled by selecting a machine from a plurality of machines that are for conducting the same process but cause different warpages to originally flat dummy wafers. For an ILD deposition process utilizing plasma-enhanced CVD (PECVD) or a dielectric CMP process, an increase or decrease in the warpage caused by the process can be controlled by adjusting the condition of the process.

Then, the warpage of the wafer can be measured again in option (step 140) for checking, possibly with a laser beam in the manner mentioned above, to check if the warpage is within a tolerable range that allows the subsequent process to be performed stably or accurately. The above steps are repeated for next wafer among the wafers.

It is particularly noted that though a wafer-base control where the process setting for each wafer is made according to the measured warpage thereof, a lot-base control can alternatively be adopted with the process setting for the other wafers being the same as that for the selected wafer, especially when the relative variation of the values of the parameter between the plurality of wafers is not large.

Figure 2:
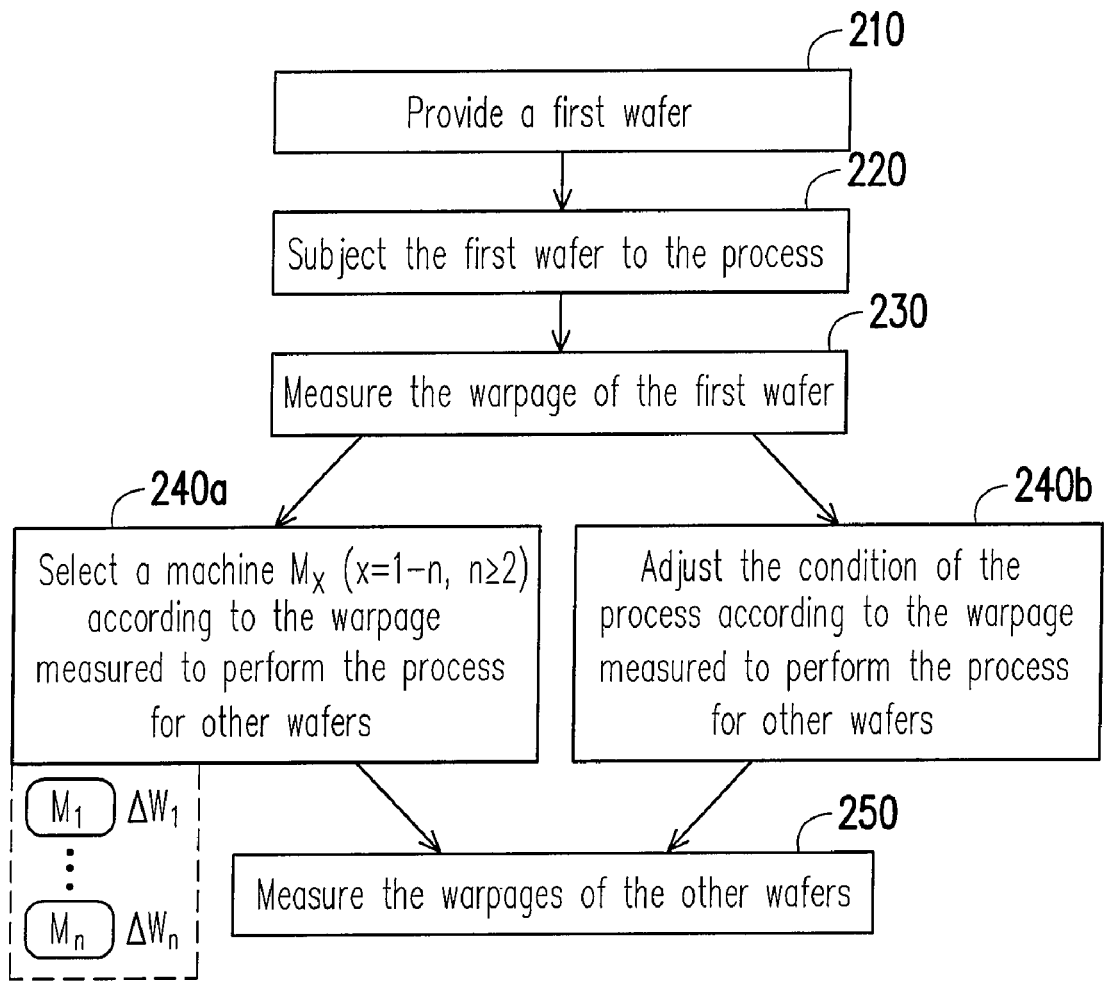
FIG. 2 is a flow chart showing a method of controlling the warpages of wafers subjected to a fabricating process according to a second embodiment of this invention.

FIG. 2 is a flow chart showing a method of controlling the warpages of wafers subjected to a fabricating process according to a second embodiment of this invention, wherein the variation between the warpages of all wafers as provided is within a certain range, such as ±10%, allowing the warp-related action to be set only once based on the warpage of the first wafer that is measured after the fabricating process.

In the step 210, a first wafer among the wafers is provided. The wafer has been subjected to a precedent fabricating process that causes warp to the wafer, and the progressive warpage of the wafer caused by the precedent fabricating process and the fabricating process to be performed has to be controlled.

In next step 220, the first wafer is subjected to the fabricating process. The fabricating process may be conducted in a machine selected from a plurality of machines that are for conducting the same fabricating process but cause different warpages to originally flat dummy wafers, or in a machine undistinguishable from the other machines for conducting the same fabricating process.

In next step 230, the warpage of the first wafer is measured, possible with a laser beam in the manner mentioned above. In next step 240a, a machine is selected, from a plurality of machines ($M_{1-n}$, $n \geqq 2$) that are for conducting the fabricating process but cause different warpages ($\Delta W_{1-n}$) to originally flat dummy wafers, according to the warpage measured to perform the fabricating process for other wafers. The data of warpages caused by the different machines may be previously collected in the manner mentioned above.

In an alternative step 240b, the condition of the fabricating process is adjusted to perform the fabricating process for other wafer. The information that which parameter(s) among all the parameters in conducting the fabricating process are correlated to wafer warpage as well the data of the variation of warpages with respect to the parameter(s) may be collected in the manner mentioned above.

In next step 250, the warpages of the other wafers are measured, possibly with a laser beam as mentioned above, to check if the warpage of each of the other wafers are within a tolerable range allowing a later fabricating process to be performed stably or accurately.

Furthermore, the method of this invention is not limited to apply to control the warpages of a plurality of wafers through one fabricating process, but can also be applied to control the warpages of a plurality of wafers through a sequence of fabricating processes. Similarly, the warpage control can be a wafer-base control where the setting of each fabricating process for each wafer is made according to the measured warpage thereof, or alternatively a lot-base control where the setting of each fabricating process for the other wafers is the same as that of the fabricating process for the selected wafer. An embodiment of wafer-base control is described as follows.

Figure 3:
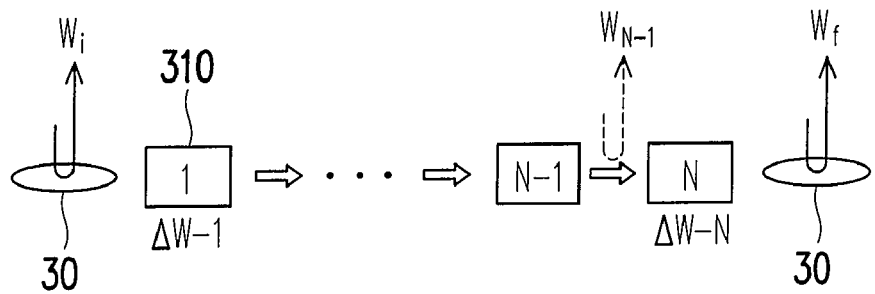
FIG. 3 illustrates a method of controlling the warpages of a wafer subjected to a plurality of fabricating processes according to a third embodiment of this invention.

FIG. 3 illustrates a method of controlling the warpages of wafers subjected to a plurality of fabricating processes according to a third embodiment of this invention.

Referring to FIG. 3, the third embodiment of this invention is different from the first one in that a wafer is subjected to a plurality of fabricating processes 1 to N ($N \geqq 2$), wherein a warp-related setting is made for each fabricating process according to the warpage "$W_i$" measured to control the warpage ($\Delta W_M$, $M=1-N$) attributed by the process (M). For one fabricating process, making a warp-related setting may include selecting a machine from a plurality of machines that are for conducting the same fabricating process but cause different warpages to originally flat dummy wafers, or include adjusting the condition of the fabricating process.

For example, for an ILD deposition process utilizing APCVD, a TiN deposition process, a tungsten CVD process, a tungsten CMP process or a aluminum deposition process, an increase or decrease in the warpage caused by the process can be controlled by selecting a machine from a plurality of machines that are for conducting the same fabricating process but cause different warpages to originally flat dummy wafers. For an ILD deposition utilizing PECVD or a dielectric CMP process, an increase or decrease in the warpage caused by the fabricating process can be controlled by adjusting the condition of the process, wherein one or more parameters can be adjusted.

Because the number of the combinations of the warp-related settings of all the fabricating processes rapidly increases with the number of the fabricating processes, the warp-related settings of the fabricating processes are preferably made by means of a computer program. In addition, it is preferred to further measure the warpage ($W_{N-1}$) of the wafer after the fabricating process "N−1" but before the last fabricating process "N" and modifying the warp-related setting for the fabricating process "N" according to $W_{N-1}$, so as to ensure that the warpage of the wafer after the fabricating process "N" is within the tolerable range.

Figure 4:
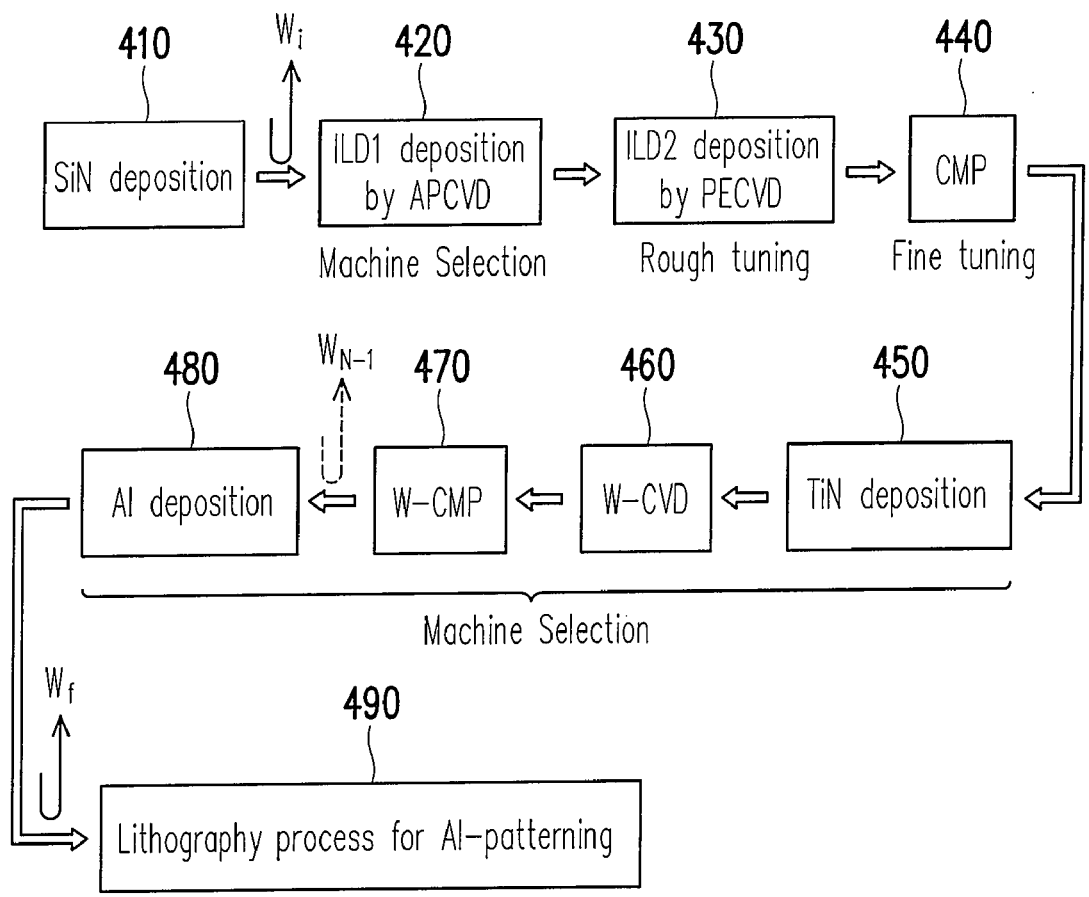
FIG. 4 illustrates a method of controlling the warpages of wafers in an example according to the third embodiment of this invention.

FIG. 4 illustrates a method of controlling the warpages of wafers in an example according to the third embodiment of this invention. A wafer is subjected to a series of fabricating processes 410-490 in this example, wherein a fabricating process is conducted directly after the precedent fabricating process shown in the figure or indirectly after the precedent fabricating process with one or more fabricating processes not shown between them.

The fabricating processes 410-490 are for fabricating a semiconductor device, including, in the sequence of their conductions, an SiN deposition process 410, an ILD1 ($1^{st}$ ILD layer) deposition process 420 utilizing APCVD, an ILD2 ($2^{nd}$ ILD layer) deposition process 430 utilizing PECVD, a CMP process 440 for the ILD2, a TiN deposition process 450, a tungsten CVD process 460, a tungsten CMP process 470, an aluminum deposition process 480 and the lithography process 490 for the patterning of the aluminum deposited. It is noted that the SiN deposition process 410 usually causes a remarkable warpage to the wafer. The ILD1 deposition process 420 and the Al-deposition process 480 respectively correspond to the process "1" and the process "N" in the third embodiment of this invention. The lithography process 490 requires the warpage being within a certain range so that the accuracy of pattern transfer is assured.

For some of the fabricating processes 420-480, the step of making a warp-related setting for each of them includes selecting a machine from a plurality of machines that are for conducting the same fabricating process but cause different warpages to originally flat dummy wafers. For the other fabricating processes, the step of malting a warp-related setting for each of them comprises adjusting a condition of the fabricating process that is related to wafer warpage.

Specifically, for each of the ILD1 deposition process 420, the TiN deposition process 450, the tungsten CVD process 460, the tungsten CMP process 470 and the aluminum deposition process 480, an increase or decrease in the warpage caused by the process can be controlled by selecting a machine from a plurality of machines that are for conducting the same fabricating process but cause different warpages to originally flat dummy wafers. For each of the ILD2 deposition process 430 utilizing PECVD and the CMP process 440, an increase or decrease in the warpage caused by the process can be controlled by adjusting the condition of the fabricating process, wherein one or more parameters can be adjusted. An increase or decrease in the warpage caused by the ILD2 deposition process 430 can be controlled by a rough tuning in the RF power of the PECVD thereof, while that in the warpage caused by the CMP process 440 can be controlled by a fine tuning to one or more of the parameters thereof.

In addition, it is preferred to further measure the warpage ($W_{N-1}$) of the wafer after the tungsten CMP process 470 (N−1) but before and the aluminum deposition process 480 (N) and modifying the warp-related setting for the aluminum deposition process 480, so as to ensure that the warpage of the wafer after the aluminum deposition process 480 is within the tolerable range.

By utilizing the invention of any of the above embodiments, the warpage of the wafer can be controlled within a tolerable range so that the wafer is not easily damaged in subsequent processes and/or a later process is conducted stably or accurately.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of controlling warpage of a wafer subjected to a plurality of processes, the method being implemented by an IC manufacturing system, and the method comprising:
    measuring the warpage of the wafer by using a laser beam to scan a surface of the wafer before the processes are performed; and
    making a warp-related setting for at least one of the processes according to the warpage measured to perform the processes for the wafer, such that the warpage of the wafer is within a tolerable range after the processes, wherein
    making the warp-related setting for the at least one process comprises: selecting a machine from a plurality of machines by a controller to perform the process for the wafer, the machines being for conducting the same process but cause different warpages to an originally flat dummy wafer.

2. The method of claim 1, wherein a number of the processes is N (N≧2), further comprising: measuring the warpage of the wafer after the (N−1)$^{th}$ process but before the N$^{th}$ process, and modifying the warp-related setting for the N$^{th}$ process according to the warpage measured after the (N−1)$^{th}$ process but before the N$^{th}$ process.

3. The method of claim 1, wherein
    for some processes, making a warp-related setting for each of them comprises selecting a machine from a plurality of machines that are for conducting the same process but cause different warpages to originally flat dummy wafers; and
    for the other processes, making a warp-related setting for each of them comprises adjusting a condition of the process.

* * * * *